Aug. 19, 1969 E. L. BARLOW, JR 3,462,614

FREQUENCY SELECTIVE CIRCUIT WITH OUTPUT ACCORDING TO A RATIO OF ALTERNATING CURRENT SIGNALS-TO-DIRECT CURRENT SIGNALS WHICH VARIES WITH FREQUENCY

Filed Oct. 24, 1965

INVENTOR.
EDSON L. BARLOW, JR.
BY
Barnes, Kisselle, Raisch & Choate
ATTORNEYS

United States Patent Office 3,462,614
Patented Aug. 19, 1969

3,462,614

FREQUENCY SELECTIVE CIRCUIT WITH OUTPUT ACCORDING TO A RATIO OF ALTERNATING CURRENT SIGNALS-TO-DIRECT CURRENT SIGNALS WHICH VARIES WITH FREQUENCY

Edson L. Barlow, Jr., Rochester, Mich., assignor to Berry Industries, Inc., Birmingham, Mich., a corporation of Michigan Filed Oct. 24, 1965, Ser. No. 504,811
Int. Cl. H03k *17/60, 17/70*
U.S. Cl. 307—233 2 Claims

ABSTRACT OF THE DISCLOSURE

Frequency selective circuit for a garage door operator responsive to a code frequency wherein input signals are impressed on a voltage divider comprising a parallel tuned circuit and a series resistor coupled in the gate circuit of a controlled rectifier. A rectifier and a capacitor connected in series across the resistor develop a reverse DC bias for the controlled rectifier at frequencies other than the code frequency but when the code frequency predominates the reverse bias is overcome by the AC signal developed across the tuned circuit.

This invention relates generally to frequency selective circuits, and particularly to a frequency selective circuit suitable for use in radio remote control systems.

It is an object of this invention to reduce the number of components in selective circuits of the frequency discriminating type.

Another object of the invention is to achieve gain in a selective circuit of the frequency discriminating type A further object of the invention is to provide a frequency selective circuit in which there is sufficient gain that a load such as a relay may be driven directly by the output signal from the selective circuit without further amplification of the signal Among the other objects of the invention are to provide a frequency selective circuit which is simple, reliable and economical; which is stable with respect to ambient conditions; which is responsive only to input signals within a narrow range of frequencies independent of signal strength; which is responsive to input signals within that narrow range only when the signal amplitude is above a predetermined threshold and is significantly greater than any other frequencies which may also be present; and which has a range of response that may be adjusted by selection of circuit values.

Figure 1:
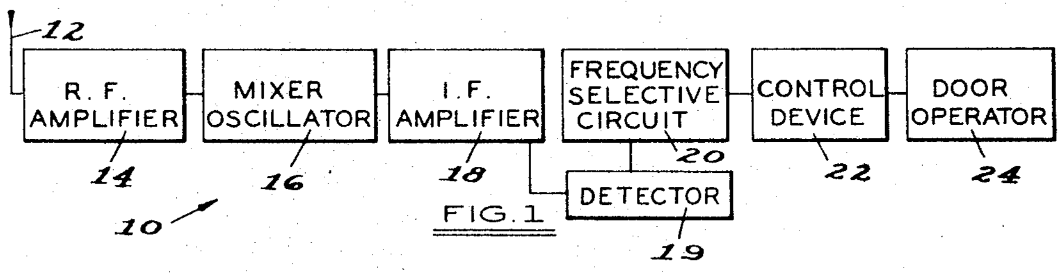
FIG. 1 is a block diagram of a receiver for a radio remote control system serving as a garage door opener.

Although the utility of the frequency selective circuit of the invention is not limited to radio remote controlled door openers, the circuit may be advantageously used in the receiver of such a system as indicated in FIG. 1. The overall receiver 10 is conventional, and has suitably coupled in succession an antenna 12, a radio frequency amplifier 14 for amplifying received signals, a mixer-oscillator 16 for heterodyning the signals to an intermediate frequency, an I.F. amplifier 18 for amplifying the intermediate frequency signals and a detector 19 for demodulating the intermediate frequency to extract the audio frequency. The audio frequency signals are fed to the frequency selective circuit 20 of the present invention which responds only to signals within a predetermined narrow frequency range intended to activate this particular receiver. Garage door operators installed in the same neighborhood are provided with receivers adapted to respond to different frequency ranges, and in this way coding of signals may be accomplished so that a given transmitter will operate only its associated receiver. More than one frequency selective circuit may be used in a receiver, the selective circuits being responsive to different frequency ranges to separate different control functions.

Frequency selective circuit 20 supplies an output signal which drives a control device 22 which may be a relay, and control device 22 in turn actuates an electromechanical door operator 24 which opens the door of a garage where the receiver is installed.

Although a receiver for a system employing a modulated carrier wave has been illustrated, the frequency selective circuit may be used in non-carrier systems as well.

One of the advantages of the frequency selective circuit of the invention is that it provides enough gain that it is not essential to amplify the signal further before supplying it to a control device. This eliminates components and wiring from known circuits without impairing reliability.

Figure 2:
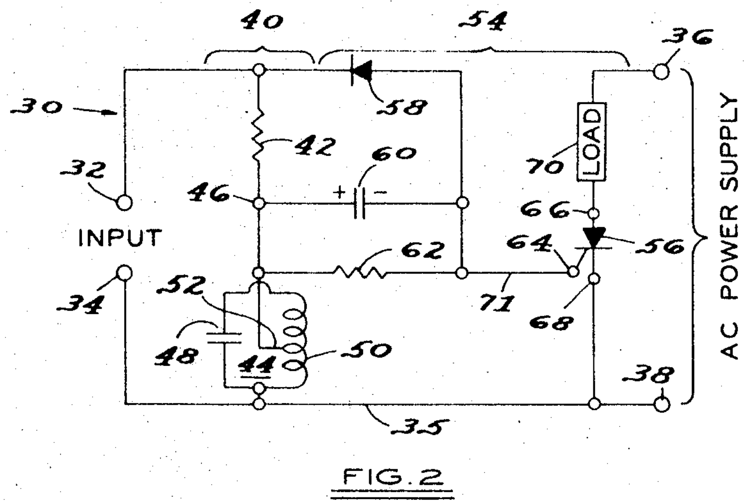
FIG. 2 is a circuit diagram of an embodiment of the invention in which gain is supplied by a semiconductor controlled rectifier.
Figure 3:
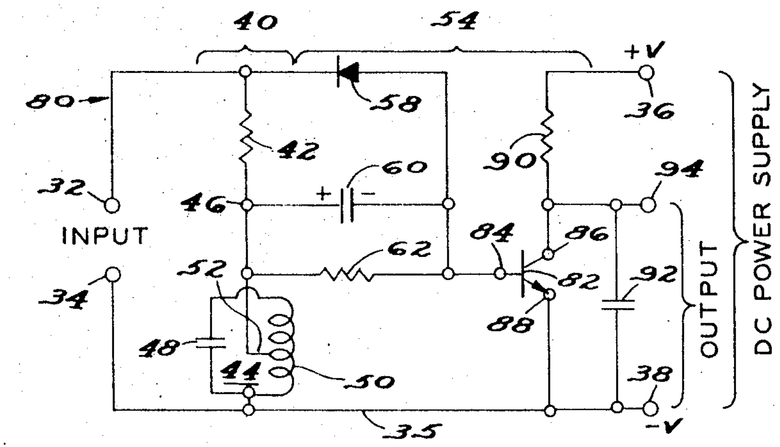
FIG. 3 is a circuit diagram of another embodiment of the invention in which gain is supplied by a transistor.

One embodiment of the frequency selective circuit 20 is shown schematically in FIG. 2 wherein the circuit designated generally as 30 has signal input terminals 32 and 34 and power supplying terminals 36 and 38. Terminals 34 and 38 are connected together by conductor 35 and so are at the same potential. The input signal to which circuit 30 responds is typically an audio frequency which is the code frequency associated with circuit 30. Selective circuit 30 includes a voltage divider 40 connected between signal input terminals 32 and 34. Voltage divider 40 includes a resistor 42 and a parallel resonant circuit 44 which together provide an impedance-dependent voltage ratio $V_{44}/V_{42}$ with respect to an intermediate point 46 in the voltage divider. Parallel resonant circuit 44 consists of a capacitor 48 and an inductor 50 connected in parallel with each other and in series with resistor 42. Preferably the connection from resonant circuit 44 to resistor 42 is adjustably made to a point along inductor 50 by means of a tap 52, but a tapped inductor is not essential.

The values of capacitor 48 and inductor 50 are selected or adjusted to make circuit 44 resonant at the code frequency with which the input signal is modulated. Therefore, circuit 44 presents a maximum impedance to the code frequency and presents less impedance to frequencies above and below the code frequency. It may be seen, then, that the ratio of the impedance of circuit 44 to the impedance of resistor 42 varies with frequency. The ratio is low for modulation frequencies on either side of the code or resonant frequency. The impedance ratio increases as frequency approaches the resonant frequency from above or below that frequency, and peaks at the resonant frequency.

In order to make circuit 30 responsive only to a very narrow range of frequencies centered at the resonant frequency, a differential detecting network 54 is employed including a semiconductor controlled rectifier 56, a diode rectifier 58, a capacitor 60 and a resistor 62. Broadly speaking, semiconductor controlled rectifier 56 is an electronic valve having an input terminal 64, an output terminal 66 and a common terminal 68 which are respectively the gate, anode and cathode of the device. Controlled rectifier 56 and diode rectifier 58 are typically silicon types, and in FIG. 1 the controlled rectifier is a PNPN type. The output and common terminals 66 and 68 respectively (anode and cathode of controlled rectifier 56) are connected in series with a load 70 between the power supplying terminals 36 and 38 which are connected to an alternating current power supply. A conductor 71 and a capacitor 60 and a resistor 62 connected in parallel with each other connects input terminal 64 (the gate of controlled rectifier 56) to the intermediate point 46 of voltage divider 40. A diode rectifier 58 also connects input terminal 64 to the signal input terminal 32, diode rectifier 58 being poled oppositely relative to controlled rectifier 56 to make this a unidirectional path for charging capacitor 60 to establish a negative bias at the gate or input terminal 64 of controlled rectifier 56, thereby rendering rectifier 56 normally non-conductive. Rectifier 56 will conduct on positive half-cycles of the supply voltage only after its gate 64 goes positive, and this happens only when the code frequency is present in the input signal. When rectifier 56 conducts, the AC power supply signal is connected across a load 70 (which may be the control device, e.g., motor relay, of receiver 10) in the anode path of rectifier 56. Controlled rectifier 56 stops conducting when the potential at terminal 64 goes negative (in response to cessation of the code frequency signal) and the supply voltage also swings negative.

When input signals of some frequency other than the code frequency are predominantly present at terminals 32 and 34, the negative half-cycles of the voltage across resistor 42 produce pulses of current through rectifier 58 which charge capacitor 60 to a negative potential, thus putting negative bias on gate 64 of controlled rectifier 56. If the proper code frequency then appears and predominates in the input signals according to the impedance ratio, the positive peaks of the voltage across resonant circuit 44 override the negative bias at terminal 64 and thereby turn on controlled rectifier 56. Thus, controlled rectifier 56 is rendered conductive to supply an output signal from circuit 30 only when a signal within a predetermined narrow frequency range predominates at the signal input terminals of the circuit.

Another embodiment of frequency selective circuit 20 is designated generally as circuit 80 in FIG. 2 and is very similar to circuit 30 of FIG. 1, the same reference numerals being used in the two figures for like components. In circuit 80 the electronic valve comprises a transistor 82 having a base 84 serving as the input terminal, a collector 86 serving as the output terminal and an emitter 88 serving as the common terminal. Direct current power is supplied to terminals 36 and 38, rather than alternating current power as in FIG. 1. A load resistor 90 is connected between terminals 86 and 36 in the collector path of the transistor, and the output signal which appears at terminal 86 when the circuit responds to a code frequency is smoothed by a capacitor 92 connected between output terminals 94 and 38. Terminal 94 is at the same voltage as collector 86. Base 84 is connetced to intermediate point 46 in voltage divider 40 through resistor 62 paralleling capacitor 60, and is also connected to signal input terminal 32 through rectifier 58 which is poled oppositely relative to the emitter-base junction of transistor 82. Transistor 82 is an NPN type, but a PNP type could be used by reversing diode 58 and reversing the supply voltage polarities.

The operation of circuit 80 is much like that of circuit 30. When input signals of some frequency other than the code frequency are predominantly present at terminals 32 and 34, capacitor 60 is charged negatively by pulses through rectifier 58, thus developing a negative voltage on capacitor 60 which biases base 84 sufficiently negatively to render transistor 82 non-conductive. If the proper code frequency then appears and predominates in the input signals at terminals 32 and 34, the positive peaks of the voltage across resonant circuit 44 override the bias at terminal 84 and cause transistor 82 to conduct strongly in a pulsating manner. The pulse currents through the collector of transistor 82 are smoothed by capacitor 92 to provide a DC output voltage at terminal 94.

Both controlled rectifier 56 and transistor 82 have sufficient gain such that it is not essential to amplify the output signal of either circuit 30 or circuit 80 in a succeeding stage before applying the signal to a control device. The frequency selective circuits of the present invention have a minimum number of components and yet perform in a reliable manner.

I claim:

1. A frequency selective circuit comprising first and second signal input terminals, first and second power supply terminals, an alternating current impedance network connected across said signal input terminals including a first capacitance, an inductance connected in parallel with said capacitance, and a resistance connected in series with the parallel combination of said inductance and said capacitance, an electronic valve having input, output and common terminals, means connecting the common and output terminals of said electronic valve between said power supply terminals, circuit means coupling said parallel inductance and capacitance combination across the input and common terminals of said electronic valve to apply to the input and common terminals of said valve an alternating current signal developed by said alternating current impedance network, a second capacitance in said coupling circuit means connected to said resistance and to said input terminal of said electronic valve, and unidirectional current conducting means operatively connected in series with said second capacitance across said resistance to provide a path for charging said second capacitance with direct current and thereby provide a potential at the input terminal of said electronic valve which biases said valve toward a non-conductive condition, said first capacitance and said inductance being tuned to respond to an input signal of a predetermined frequency at said signal input terminals and being coupled to said input and said common terminals so that said alternating current signal across the input and common terminals of said electronic valve is sufficient to override said bias to render said valve conductive in response to said predetermined frequency input signal.

2. A frequency selective circuit comprising an electron valve having a pair of output electrodes and a pair of input electrodes for controlling current conduction through said output electrodes, first and second signal input terminals for said circuit adapted to be connected to a source of signals including a predetermined signal having a predetermined frequency, voltage divider means coupled to said input terminals to develop a unidirectional bias voltage having a first polarity relative to said input electrodes in response to one polarity half cycles of said signals and to develop without rectification a pulsating voltage of an opposite polarity in response to opposite polarity half cycles of said signals, and means coupling said input electrodes of said valve to said voltage divider means so that the sum of said first polarity bias voltage and said opposite polarity pulsating voltage is applied to said input eliectrodes of said valve, and wherein said voltage divider means comprises an asymmetrical conducting device, a first capacitor, resistive impedance means and a parallel tuned circuit, said parallel tuned circuit comprises a second capacitor and an inductor tuned to said predetermined frequency, said parallel tuned circuit is serially connected with said resistive impedance means across said signal input terminals, said asymmetrical conducting device is connected in series with said first capacitor across said resistive impedance means to develop said unidirectional bias voltage across said capacitor, one terminal of said first capacitor being electrically common to one terminal of said parallel tuned circuit, and wherein said input electrodes of said valve are operatively connected, respectively, to another terminal of said first capacitor and to another terminal of said tuned circuit so that the sum of said unidirectional bias voltage of said one polarity developed on said first capacitor is summed with the opposite polarity pulsating signal across said tuned circuit and applied to said input electrodes whereby at said predetermined frequency one of said voltages controls conduction of said valve and at other frequencies the other voltage controls conduction of said valve.

References Cited

UNITED STATES PATENTS

| | | | |
|---|---|---|---|
| 2,935,731 | 5/1960 | Richter | 317—147 |
| 3,319,077 | 5/1967 | Morris | 328—210 |
| 3,333,272 | 7/1967 | Deming | 317—147 |
| 3,337,805 | 8/1967 | Joseph | 317—147 |

FOREIGN PATENTS

| | | |
|---|---|---|
| 793,665 | 11/1936 | France. |

ARTHUR GAUSS, Primary Examiner

J. D. FREW, Assistant Examiner

U.S. Cl. X.R.

307—252, 295; 328—138; 346—171